United States Patent

Fuhrmann et al.

(10) Patent No.: US 10,388,819 B2
(45) Date of Patent: Aug. 20, 2019

(54) RECEIVER UNIT

(71) Applicant: AZUR SPACE Solar Power GmbH, Heilbronn (DE)

(72) Inventors: Daniel Fuhrmann, Heilbronn (DE); Thomas Lauermann, Neuenstein (DE); Gregor Keller, Heilbronn (DE)

(73) Assignee: AZUR SPACE SOLAR POWER GMBH, Heilbronn (DE)

( * ) Notice: Subject to any disclaimer, the term of this patent is extended or adjusted under 35 U.S.C. 154(b) by 0 days.

(21) Appl. No.: 15/998,506

(22) Filed: Aug. 16, 2018

(65) Prior Publication Data

US 2019/0058074 A1 Feb. 21, 2019

(30) Foreign Application Priority Data

Aug. 16, 2017 (DE) .................. 10 2017 007 683

(51) Int. Cl.
| | |
|---|---|
| *H01L 31/062* | (2012.01) |
| *H01L 31/167* | (2006.01) |
| *H01L 27/06* | (2006.01) |
| *H01L 27/144* | (2006.01) |
| *H01L 31/0304* | (2006.01) |

(52) U.S. Cl.
CPC ........ *H01L 31/167* (2013.01); *H01L 27/0629* (2013.01); *H01L 27/1443* (2013.01); *H01L 31/0304* (2013.01)

(58) Field of Classification Search
CPC ............... H01L 31/167; H01L 31/0304; H01L 27/0629; H01L 27/1443

USPC ........................................................ 257/290
See application file for complete search history.

(56) References Cited

U.S. PATENT DOCUMENTS

| | | | |
|---|---|---|---|
| 4,996,577 A | 2/1991 | Kinzer | |
| 5,095,220 A | 3/1992 | Kaifler | |
| 8,891,573 B2 * | 11/2014 | Zhang | ............... H01S 5/323 372/43.01 |
| 2013/0299841 A1 | 11/2013 | Ranglack et al. | |

FOREIGN PATENT DOCUMENTS

| | | |
|---|---|---|
| DE | 10 2016 001 387 A1 | 8/2017 |
| EP | 0 392 373 A2 | 10/1990 |
| JP | S58161366 A | 9/1983 |
| JP | 2012256682 A | 12/2012 |

\* cited by examiner

*Primary Examiner* — Tu-Tu V Ho
(74) *Attorney, Agent, or Firm* — Muncy, Geissler, Olds & Lowe, P.C.

(57) ABSTRACT

A receiver unit having an optically operated voltage source, the voltage source including a first stack having an upper side and an underside and being formed on an upper side of a non-Si substrate based on III-V semiconductor layers arranged in the shape of a stack, and having a second electrical terminal contact on the upper side of the first stack and a first electrical terminal contact on an underside of the non-Si substrate, a voltage generated with the aid of the incidence of light onto the upper side of the first stack being present between the two terminal contacts, and including a second stack having a MOS transistor structure having III-V semiconductor layers and including a control terminal and a drain terminal and a source terminal. The MOS transistor structure being designed as a depletion field effect transistor.

15 Claims, 5 Drawing Sheets

RECEIVER UNIT

This nonprovisional application claims priority under 35 U.S.C. § 119(a) to German Patent Application No. 10 2017 007 683.9, which was filed in Germany on Aug. 16, 2017, and which is herein incorporated by reference.

BACKGROUND OF THE INVENTION

Field of the Invention

The invention relates to a receiver unit.

Description of the Background Art

Receiver units are known in optocouplers. Simple optocouplers include a transmitter unit and a receiver unit, the two units being electrically isolated but optically coupled. An example is described in U.S. Pat. No. 4,996,577.

An optically operated voltage source and a MOS transistor structure as a receiver unit are known from DE 10 2016 001 387 A1, which is incorporated herein by reference.

SUMMARY OF THE INVENTION

It is therefore an object of the present invention to provide a device which refines the prior art.

According to an exemplary embodiment of the invention, a receiver unit is provided that includes an optically operated voltage source, the voltage source including a first stack having an upper side and an underside and being formed on an upper side of a non-Si substrate based on III-V semiconductor layers arranged in the shape of a stack.

A first electrical terminal contact is formed on the upper side of the first stack, and a second electrical terminal contact is formed on the underside of the non-Si substrate.

A voltage generated by the incidence of light onto the upper side of the first stack is present between the two terminal contacts.

The receiver unit comprises a second stack, which includes an FET transistor structure comprising III-V semiconductor layers.

The FET transistor structure includes a control terminal, i.e. a gate terminal, and a drain terminal and a source terminal.

The FET transistor structure is designed as a depletion field effect transistor.

The control terminal is connected to one of the two terminal contacts, and the drain terminal is connected to the other of the two terminal contacts.

The depletion field effect transistor short-circuits the two terminal contacts of the voltage source, if the generated voltage drops below a threshold value.

It should be noted that the threshold value can correspond exactly to the threshold value of the field effect transistor. Above the threshold voltage, the transistor is closed, i.e. the channel of the transistor is depleted by the voltage present at the gate and loses its conductivity and vice versa.

It should furthermore be noted that the voltage source can include at least one p-n diode or one PIN diode made from a III-V material for generating the voltage. The band gap of the diode is designed to be smaller than the energy of the light incident upon the upper side of the first stack.

It is understood that a negative gate voltage, e.g. −2V, should be applied to block the FET transistor, for example for an N-channel depletion field effect transistor.

It should be noted that the non-Si substrate can include a III-V material such as GaAs or InP, or is made from a III-V material or includes, in particular, Ge or is made from Ge.

An advantage is that the voltage drop at the voltage source is greatly accelerated in the dark with the aid of the FET transistor switched in parallel to the output of the voltage source, in that the control voltage drops below the threshold voltage shortly after deactivation. The FET transistor becomes conductive hereby and short-circuits the two terminal contacts. The charge at the voltage source quickly decays.

Another advantage is that the transistor is very small, i.e. it may be designed with a small gate width. The gate width is preferably less than 0.3 mm, highly preferably less than 0.1 mm. In the present case, the term, gate width, is equivalent in meaning to the expression, gate breadth. It has been shown that an increase in voltage after switching on the light is only slightly prolonged by the formation of small FET transistors. The transistor can have a gate length that is smaller than the gate width. In particular, the gate length is in a range between 50 µm and 0.2 µm.

The drain terminal can be connected to the first terminal contact, and the control terminal is connected to the second terminal contact. A Schottky diode is preferably looped in between the control terminal and the source terminal. The Schottky diode preferably comprises III-V semiconductor layers and is monolithically integrated with the voltage source and is formed, in particular, on the upper side of the second stack.

The field effect transistor can be designed as an N-channel depletion FET transistor or as a P-channel depletion FET transistor.

A positive potential can be applied to the first terminal contact and a negative potential to the second terminal contact.

The first terminal contact can be connected to a first output terminal, and the source terminal is connected to a second output terminal. The output voltage is present between the two output terminals. If the first stack is irradiated with constant light, a direct voltage is present as the output voltage. If the first stack is irradiated with alternating light, an alternating voltage is present as the output voltage.

The FET structure can be formed as a second stack having an upper side and an underside in a partial area on the upper side of the first stack. The III-V semiconductor layers of the two stacks are preferably monolithically integrated.

The first stack can have a quadrilateral shape, the side surfaces of the first stack being recessed on the upper side of the non-Si substrate, so that a first circumferential, stepped shoulder is formed. The stepped surface is preferably designed to be the same size all around the first stack The second stack is recessed from the edge on the upper side of the first stack, so that a second circumferential, stepped shoulder is formed, the second stack having a significantly smaller base surface than the first stack and being disposed asymmetrically on the surface of the first stack. The first stack preferably has a side length in a range between 0.5 mm and 4 mm. The second stack preferably has a side length between 0.05 mm and 0.3 mm.

An opaque layer can be disposed on the FET transistor structure to protect the FET transistor structure against the incidence of light. A first III-V insulation layer is preferably formed on the underside of the second stack to electrically insulate the FET transistor structure from the voltage source. In one refinement, a second III-V insulation layer is additionally formed.

The FET transistor structure can include a first transistor structure designed as a channel layer and disposed above the insulation layer, and a second transistor layer is formed above the channel layer.

The voltage source can include multiple p-n diodes, a tunnel diode being formed between each of two consecutive p-n diodes, and the p-n diodes preferably each having the same band gap and/or the same material composition. The output voltage of the voltage source can increase if the multiple p-n diodes are connected in series.

It is noted that the decay of the voltage significantly decreases, in particular if a large number of diodes are connected in series, provided that the charges are not removed with the aid of the field effect transistor.

In an embodiment, no diode, in particular no Schottky diode, is looped in between the control terminal and the source terminal. In each case, the two terminal contacts are directly connected to the particular assigned output terminal.

The potential at the control terminal is not biased hereby with respect to the source terminal. If the operating voltage is present at the voltage source, the field effect transistor is nevertheless blocked in that one part of the channel remains closed between the drain terminal and the control terminal with the aid of the present operating voltage.

An advantage is that a voltage drop at the Schottky diode or at the diode is avoidable, and the decay behavior is improved, and the receiver unit may be manufactured more cost-effectively.

The second terminal contact can be connected to a second output terminal.

The control terminal and the source terminal can be short-circuited with respect to each other.

A Schottky diode can be looped in between the control terminal and the source terminal.

The first stack can be disposed on the second stack, the first stack being recessed from the edge so that a second circumferential, stepped shoulder is formed, and the second stack can have a much smaller base surface than the first stack.

The first stack can be disposed laterally next to the second stack, and a filled trench is formed between the two stacks.

The diode can be designed as a transistor structure. Also, a normal diode may be formed instead of a Schottky diode.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
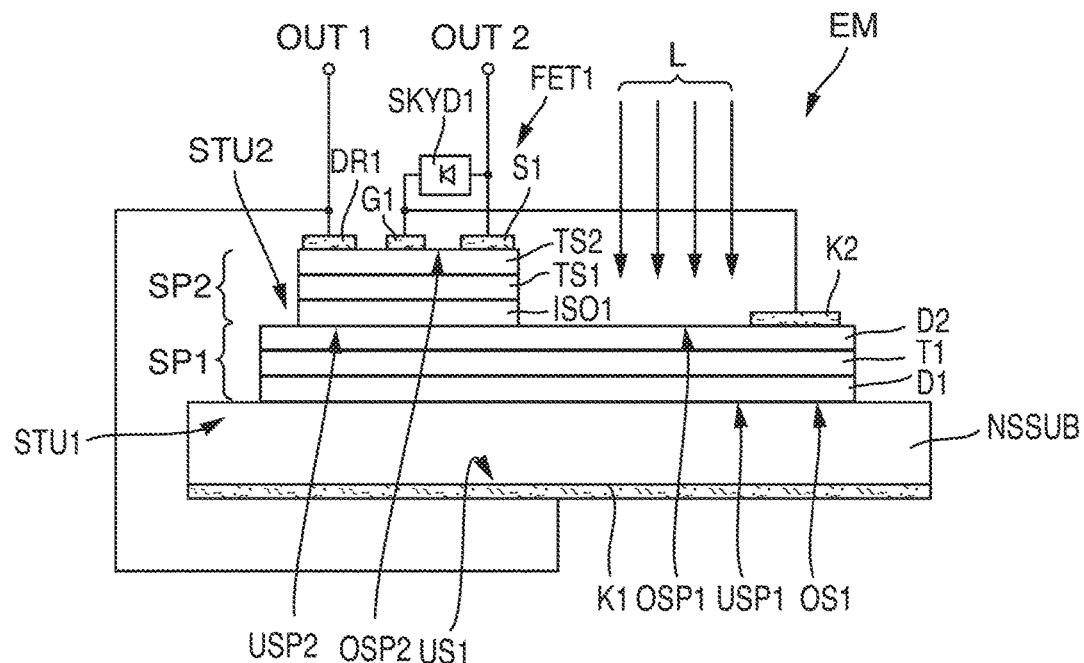
FIG. 1 shows a receiver unit according to an embodiment.

The illustration in FIG. 1 shows a receiver unit EM in an embodiment. A receiver unit EM of this type is preferably integrated together with a transmitter into a shared housing as part of an optocoupler.

Receiver unit EM comprises an optically operated voltage source SP in a first stack SP1, formed on the basis of III-V semiconductor layers arranged in the shape of a stack. First stack SP1 has an upper side OSP1 and an underside USP1 and is disposed with underside USP1 on an upper side OS1 of a non-Si substrate NSSUB.

Voltage source SP has a first electrical terminal contact K1 on an underside US1 of non-Si substrate NSSUB. A second electrical terminal contact K2 is formed on an upper side OSP1 of the stack of the III-V semiconductor layers. An incidence of light L takes place only on upper side OSP1 of the stack.

Voltage source SP includes a first diode D1 and a second diode D2 supported on the non-Si substrate. A tunnel diode T1 is formed between first diode D1 and second diode D2. The two diodes D1 and D2 are connected in series with the aid of tunnel diode T1. In other words, the partial voltages of the two diodes D1 and D2 add up.

Upon an incidence of light L onto the upper side of first stack SP1, a voltage generated with the aid of light L is present between the two terminal contacts K1 and K2.

To avoid short-circuits on the side surfaces, in particular, the layers of voltage source SP, i.e. of first stack SP1, are recessed on all sides with respect to non-Si substrate NSSUB, so that an first circumferential, stepped shoulder STU1 forms.

A second stack SP2, which includes a FET transistor structure FET1 having III-V semiconductor layers, is formed on upper side OSP1 of first stack SP2. Second stack SP2 has an upper side OSP2 and an underside USP2.

FET transistor structure FET1, which in the present case is designed as an N-channel depletion field-effect transistor, includes a control terminal G1 and a drain terminal DR1 and a source terminal S1.

Second stack SP2 has a much smaller base surface than does first stack SP1 and is disposed asymmetrically on upper side OSP1 of first stack SP1, i.e. it is situated at a different distance from the edge of upper side OSP1.

Second stack SP2 is thus recessed on all sides with respect to the edge of first stack SP1, so that a second circumferential, stepped shoulder STU2 forms.

A III-V insulation layer ISO1 is formed on the underside of second stack SP2 to electrically insulate FET transistor structure FET1 from voltage source SP.

A first transistor layer TS1, designed as a channel layer, is disposed above insulation layer ISO1. A second transistor layer RS1 is formed above the channel layer.

Drain terminal DR1 is connected to first terminal contact K1 and to first output terminal OUT1. Control terminal G1 and source terminal S1 are connected to second terminal contact K2 and to a second output terminal OUT2.

A Schottky diode SKYD1 is looped between control terminal G1 and source terminal S1.

The field effect transistor short-circuits the two terminal contacts K1 and K2 or the two output terminals OUT1 and OUT2, if the generated voltage drops below a threshold value, i.e. below the threshold voltage of the field effect transistor.

Figure 2:
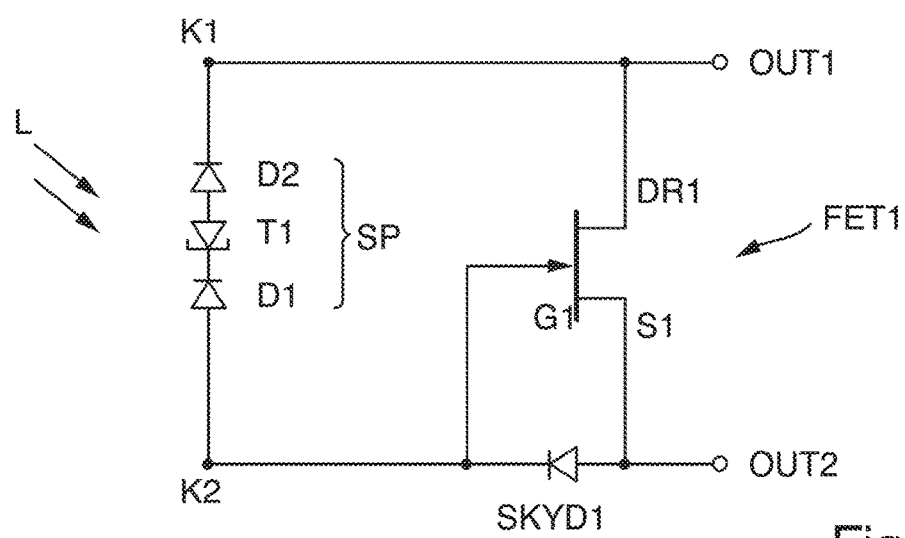
FIG. 2 shows an equivalent diagram, including N-channel FET transistor, of a receiver unit, with the addition of a Schottky diode.

The illustration in FIG. 2 shows an equivalent diagram of a receiver unit EM according to the first specific embodiment. Only the differences from the specific embodiment illustrated in FIG. 1 are explained below.

Schottky diode SKYD1 is looped between control terminal G1 and source terminal S1 to bias the potential at control terminal G1 with respect to source terminal S1, i.e. if the operating voltage is present at voltage source SP, the field effect transistor is blocked.

By looping in Schottky diode SKYD1, the potential at second output terminal OUT2 is reduced compared to the potential at second terminal contact K2 by a small voltage drop, since Schottky diode SKYD1 is polarized in the forward direction during operation.

Figure 3:
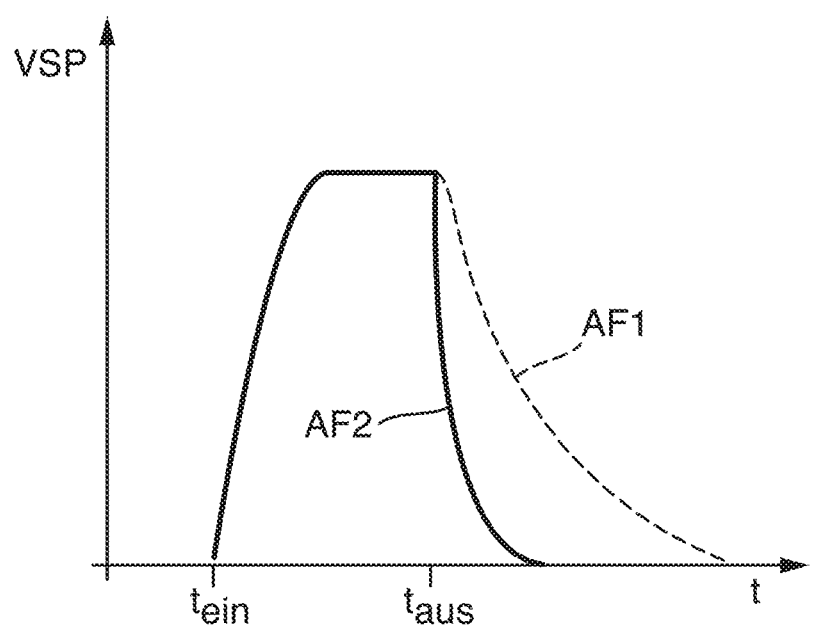
FIG. 3 shows a voltage curve of the receiver unit.

The illustration in FIG. 3 shows a voltage curve of receiver unit EM according to the first specific embodiment. Only the differences from the specific embodiment illustrated in FIG. 1 are explained below.

The time profile of the voltage of voltage source SP is plotted. At a point in time $t_{on}$, upper side OSP1 of first stack SP1 is irradiated with light L, and at a point in time $t_{off}$, light L is turned off.

It is apparent that the voltage rapidly increases to a maximum value at point in time $t_{on}$ and, after deactivation, has a decay curve AF1 without the field effect transistor and a decay curve AF2 with the field effect transistor. In other words, the decay behavior of the voltage source is greatly improved with the aid of the field effect transistor.

Figure 4:
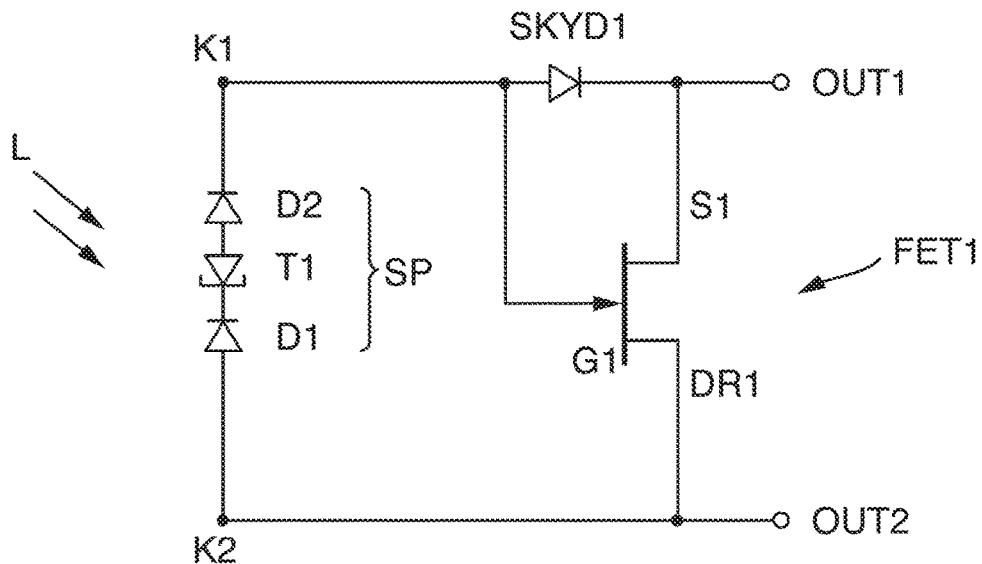
FIG. 4 shows an equivalent diagram, including a P-channel FET transistor, of a receiver unit, to which a Schottky is added.

The illustration in FIG. 4 shows an equivalent diagram of a receiver unit, including a P-channel FET transistor, to which a Schottky diode is added. Only the differences from the specific embodiment illustrated in FIG. 1 are explained below.

In the present case, FET transistor structure FET1 is designed as a p-channel depletion field effect transistor.

Control terminal G1 is connected to first terminal contact K1, and source terminal S1 is connected to first output terminal OUT1.

Schottky diode SKYD1 is looped in between control terminal G1 and source terminal S1 to bias the potential at control terminal G1 with respect to source terminal S1, i.e. if the operating voltage is present at voltage source SP, the field effect transistor is blocked.

By looping in Schottky diode SKYD1, the potential at first output terminal OUT1 is reduced compared to the potential at second terminal contact K2 by a small voltage drop, since Schottky diode SKYD1 is polarized in the forward direction during operation.

Drain terminal DR1 is connected to second terminal contact K2 and to second output terminal OUT2.

The field effect transistor short-circuits the two terminal contacts K1 and K2 and the two output terminals OUT1 and OUT2, if the generated voltage drops below a threshold value, i.e. below the threshold voltage of the field effect transistor.

Figure 5:
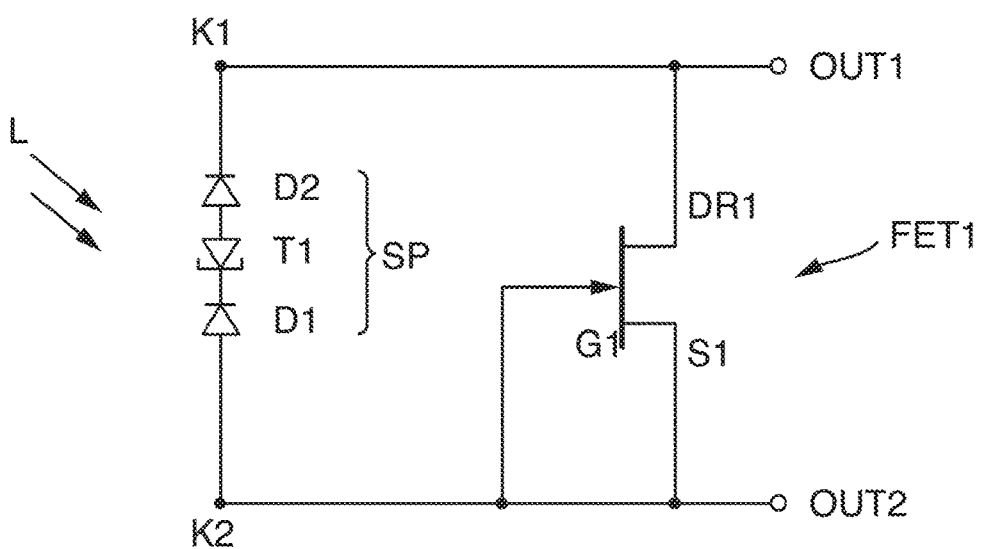
FIG. 5 shows an equivalent diagram of a receiver unit, including the N-channel FET transistor without a Schottky diode.

The illustration in FIG. 5 shows an equivalent diagram of a receiver unit EM, including the N-channel FET transistor, without a Schottky diode. Only the differences from the specific embodiment illustrated in FIG. 2 are explained below.

Schottky diode SKYD1 is omitted between control terminal G1 and source terminal S1 of N-channel FET transistor FET1, i.e. the potential at control terminal G1 is not biased with respect to source terminal S1. If the operating voltage is present at voltage source SP, the field effect transistor is nevertheless blocked in that one part of the channel remains closed between drain terminal DR1 and control terminal G1 with the aid of the operating voltage present there.

Figure 6:
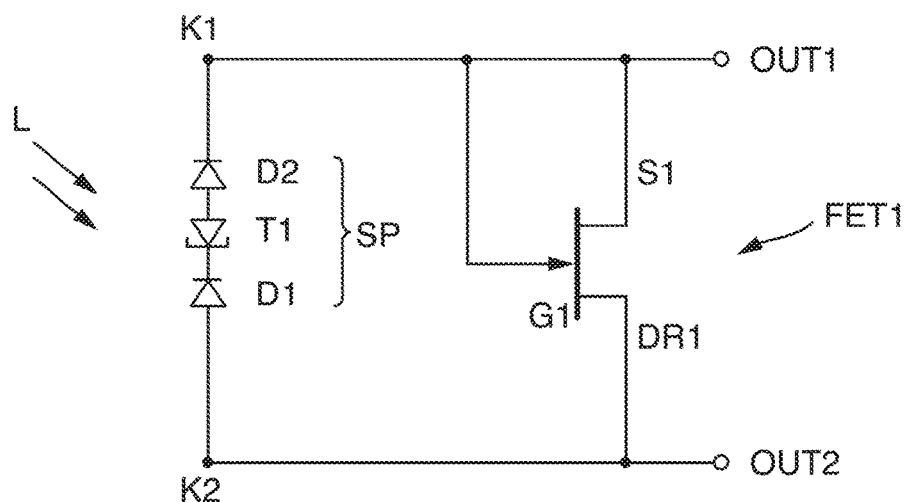
FIG. 6 shows an equivalent diagram of a receiver unit, including the P-channel FET transistor without a Schottky diode.

The illustration in FIG. 6 shows an equivalent diagram of a receiver unit EM, including the P-channel FET transistor, without the Schottky diode illustrated in FIG. 4. Only the differences from the specific embodiment illustrated in FIG. 4 are explained below.

Schottky diode SKYD1 is omitted between control terminal G1 and source terminal S1 of P-channel FET transistors FET1, i.e. the potential at control terminal G1 is not biased with respect to source terminal S1. If the operating voltage is present at voltage source SP, the field effect transistor is nevertheless blocked in that one part of the channel remains closed between drain terminal DR1 and control terminal G1 with the aid of the operating voltage present there.

Figure 7:
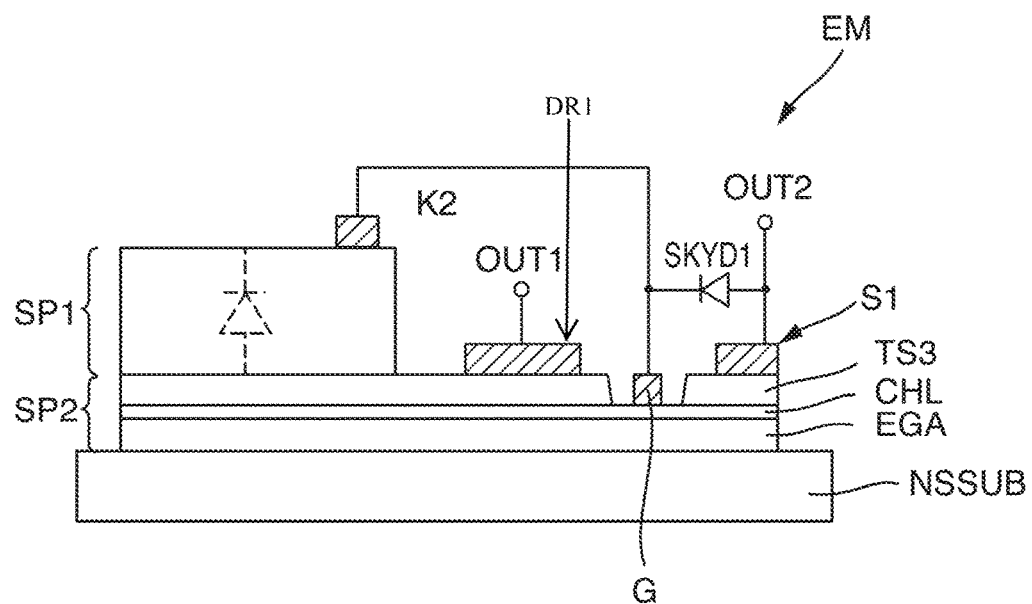
FIG. 7 shows a receiver unit in an embodiment.

The illustration in FIG. 7 shows a receiver unit EM in a second specific embodiment. Only the differences from the specific embodiment illustrated in FIG. 1 are explained below.

First stack SP1 of receiver unit EM is disposed on second stack SP2. The second stack is disposed on non-Si substrate NSSUB.

Second stack SP2 is designed to be laterally larger than first stack SP1 and comprises a preferably semi-insulating III-V semiconductor layer EGA formed on the non-Si substrate. In particular, III-V semiconductor layer EGA includes or is made up of GaAs.

A channel layer CHL, which covers the entire surface, is formed above III-V semiconductor layer EGA. A laterally structured, electrically conductive III-V transistor layer TS3 is formed on channel layer CHL. Drain terminal DR1 and source terminal S1 are formed on transistor layer TS3. Control terminal G is formed between drain terminal DR1 and source terminal S1 on channel layer CHL. In an embodiment, an insulation layer, preferably comprising a dielectric such as Hf oxide and/or Si oxide and/or Si nitride, is formed beneath control terminal G1 in the area between drain terminal DR1 and source terminal S1.

Figure 8:
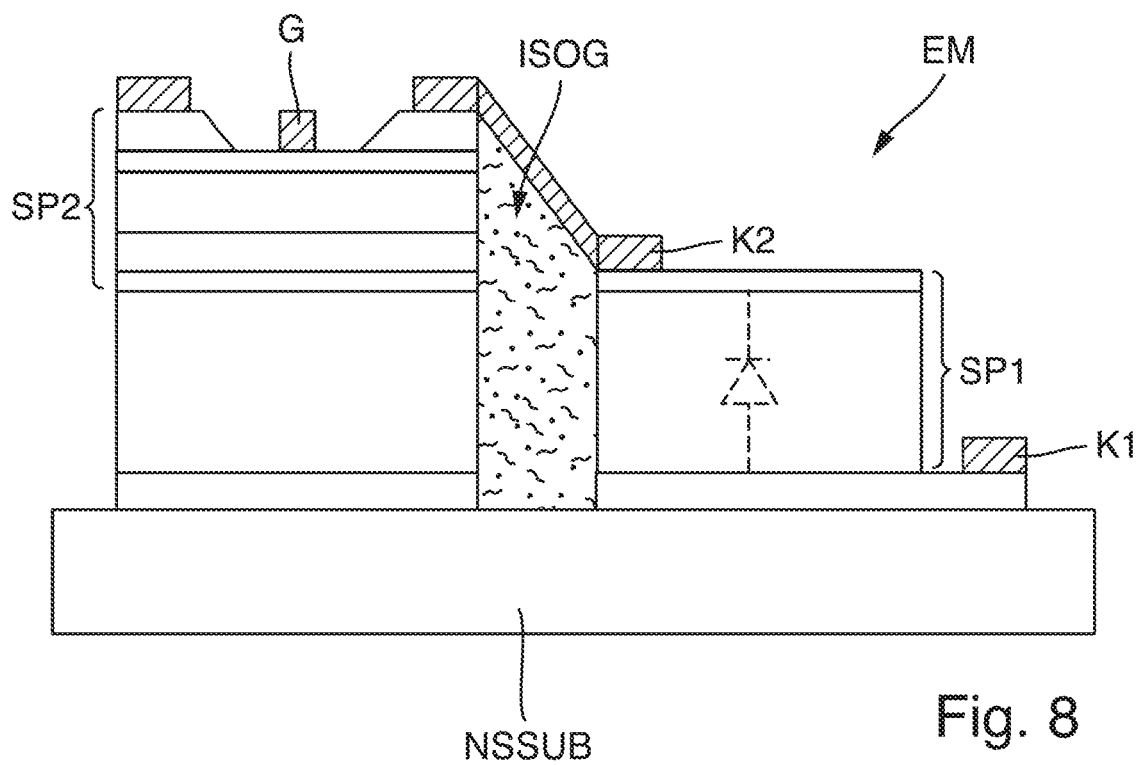
FIG. 8 shows a receiver unit in an embodiment.

The illustration in FIG. 8 shows a receiver unit EM in a third specific embodiment. Only the differences from the specific embodiment shown in FIG. 1 and FIG. 7 are explained below.

First stack SP1 of receiver unit EM is disposed laterally next to second stack SP2, the sequence of layers beneath second stack SP2 corresponds to the sequence of layers of first stack SP1. Both stacks SP1 and SP2 are each disposed on a shared non-Si substrate NSSUB.

A trench ISOG is formed between the two stacks SP1 and SP2, trench ISOG being filled with an electrically insulating material. The material preferably comprises a dielectric, for example Hf oxide and/or Si oxide and/or Si nitride. Second terminal contact K2 is connected to either source terminal S1 or drain terminal DR1 with the aid of a printed conductor. First terminal contact K1 is disposed laterally next to first stack SP1 directly on the surface of the non-Si substrate.

What is claimed is:

1. A receiver unit having an optically operated voltage source, the receiver unit comprising:
a first stack having an upper side and an underside and being formed on an upper side of a non-Si substrate based on III-V semiconductor layers arranged in a shape of a stack;
a first electrical terminal contact disposed on an underside of the non-Si substrate,
a second electrical terminal contact disposed on the upper side of the first stack, a voltage being generated via incident light on the upper side of the first stack that is disposed between the two terminal contacts; and
a second stack having a FET transistor structure comprising III-V semiconductor layers that include a control terminal and a drain terminal and a source terminal,
wherein the FET transistor structure is a depletion field effect transistor,
wherein the control terminal is connected to one of the two terminal contacts, and the drain terminal is connected to the other of the two terminal contacts, and
wherein the field effect transistor short-circuits the two terminal contacts if the generated voltage drops below a threshold value.

2. The receiver unit according to claim 1, wherein the drain terminal is connected to the first terminal contact, and the control terminal is connected to the second terminal contact.

3. The receiver unit according to claim 1, wherein the field effect transistor is designed as an N-channel depletion FET transistor or as a P-channel depletion FET transistor.

4. The receiver unit according to claim 1, wherein the first terminal contact is connected to a first output terminal, and wherein the source terminal is connected to a second output terminal.

5. The receiver unit according to claim 1, wherein the FET structure is a second stack having an upper side and an underside in a partial area on the upper side of the first stack, and wherein the III-V semiconductor layers of the two stacks are monolithically integrated.

6. The receiver unit according to claim 1, wherein the first stack has a quadrilateral shape and the side surfaces of the first stack are recessed on the upper side of the non-Si substrate so that a first circumferential, stepped shoulder is formed.

7. The receiver unit according to claim 1, wherein the second stack is recessed from an edge on the upper side of the first stack so that a second circumferential, stepped shoulder is formed, the second stack having an essentially smaller base surface than the first stack and being disposed asymmetrically on the surface of the first stack.

8. The receiver unit according to claim 1, wherein an opaque layer is disposed on the FET transistor structure to protect the FET transistor structure against the incidence of light, and wherein a first III-V insulation layer is formed on the underside of the second stack to electrically insulate the FET transistor structure from the voltage source.

9. The receiver unit according to claim 1, wherein the FET transistor structure includes a first transistor layer designed as a channel layer and disposed above the insulation layer, and wherein a second transistor layer is formed above the channel layer.

10. The receiver unit according to claim 1, wherein the voltage source includes multiple p-n diodes, wherein a tunnel diode is formed between each of two consecutive p-n diodes, and wherein the p-n diodes each have a same band gap.

11. The receiver unit according to claim 1, wherein the second terminal contact is connected to a second output terminal.

12. The receiver unit according to claim 1, wherein the control terminal and the source terminal are short-circuited with respect to each other.

13. The receiver unit according to claim 1, wherein a Schottky diode is looped in between the control terminal and the source terminal.

14. The receiver unit according to claim 1, wherein the first stack is disposed on the second stack, wherein the first stack is recessed from an edge so that a second circumferential, stepped shoulder is formed, and wherein the second stack has a smaller base surface than the first stack.

15. The receiver unit according to claim 1, wherein the first stack is disposed laterally next to the second stack, and wherein a filled trench is formed between the two stacks.

* * * * *